(12) United States Patent
Horton et al.

(10) Patent No.: US 6,295,128 B1
(45) Date of Patent: Sep. 25, 2001

(54) OPTICAL ALIGNMENT OF SUPERPOSITIONED OBJECTS

(75) Inventors: Raymond Robert Horton, Dover Plains; Chandrasekhar Narayan, Hopewell Junction; Michael Jon Palmer, Walden, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/476,178

(22) Filed: Jun. 7, 1995

(51) Int. Cl.⁷ ................................................. G01B 11/00
(52) U.S. Cl. ............................................. 356/400; 348/87
(58) Field of Search ..................................... 356/399, 400; 359/72, 87, 88; 348/87, 88, 94

(56) References Cited

U.S. PATENT DOCUMENTS 4,037,969 * 7/1977 Feldman et al. ..................... 356/400
5,194,948 * 3/1993 L'Esperance, III et al. .......... 348/87

OTHER PUBLICATIONS

O'Mara, W.C., "Active Matrix Liquid Crystal Displays–Part 1: Manufacturing Process", Solid State Technology, Dec. 1991, pp. 65–70.
Plach,et al, "Liquid Crystals for Active Matrix Displays", Solid State Technology, Jun. 1992, pp. 186–193.

* cited by examiner

Primary Examiner—Frank G. Font
Assistant Examiner—Philip Natividad
(74) Attorney, Agent, or Firm—Daniel P. Morris; Alvin J. Riddles

(57) ABSTRACT

In alignment of superpositioned objects on opposing substrates accuracy and simplicity is achieved through relative movement of the substrates responsive to an image of one object reflected from the surface of the opposite substrate. Alignment of mating fine pitch conductors and pads for bonding is achieved by observation of the reflection of one conductor or pad in the surface of the opposite substrate and relatively moving the substrates to eliminate the reflection.

7 Claims, 1 Drawing Sheet

OPTICAL ALIGNMENT OF SUPERPOSITIONED OBJECTS

FIELD OF THE INVENTION

The invention is in the field of tools for use in the manufacturing of electronic apparatus in sizes that are smaller than the normal positioning tolerances in the art and in particular to the alignment of objects in locations with difficult accessability.

BACKGROUND OF THE INVENTION

In the fabrication of electronic apparatus downsizing efforts have reached a level that objects that are not rigid, are temperature sensitive and which have connections that are spaced at a pitch so close that the connections are at less than normal positioning tolerances and which are located in difficult locations must be assembled into an operational apparatus.

An illustration of such a situation is present in an aspect of the evolving technology of flat panel displays, known in the art as active matrix technology. In the active matrix type technology in essence semiconductor switching and amplification is provided at each pixel of the display raster mounted in a translucent assembly. An illustration of a manufacturing process in the active matrix technology is described in the technical article titled "active Matrix Liquid Crystal Displays, Part 1, Manufacturing Process" by William C. O'Mara in the Journal "Solid State Technology", December 1991, Pages 65–70. The liquid crystals themselves and the driving circuits therefor are described in the technical article titled "Liquid Crystals for Active Matrix Displays", by H. Plach et al, in the Journal "Solid State Technology", June 1992, Pages 186–193.

In technologies where there are fine pitch connections that have to be made at high precision in marginally accessible locations there is a need for tooling that will facilitate the fabrication operations.

SUMMARY OF THE INVENTION

The invention is a tooling principle, wherein, the reflecting properties of the faces of superimposed objects are employed in establishing superposition alignment and relative position of the objects. Angular directed optical magnification is used to define superpositioning in alignment of superimposed contacts in difficult accessability locations such as fine periodicity pads or conductors between optically opaque substrates. Contact pads, deposited to a periodicity of less than 100 micrometers on one side of a flex tape and on an opposing surface of a semiconductor chip are placed in superimposed alignment using angled microscope reflection observation for alignment.

DESCRIPTION OF THE INVENTION

In the fabrication of electronic apparatus there are situations where objects must be aligned in superimposed relationship in places where direct observation is difficult or impossible.

As an illustration the forming of bonds between connector pads or conductors on a surface of one part that must be joined to pads or conductors on an opposing surface of another part. In such a situation the alignment is hampered because the parts of the electronic apparatus on which the pads or conductors are mounted interfere with observation.

This is particularly the case when the spacing involving the width and separation of the objects becomes less than 100 micrometers.

In forming a bond between conductors on an electronic apparatus being assembled, the pitch or periodicity of the conductor spacing, the relative expansion of the apparatus parts, the force that is involved in the bonding and the relative flexibility of the apparatus parts become active considerations in alignment. Frequently the parts of the apparatus are pliable such as the translucent backed flex tape with conductors deposited on it extensively used in the art whereas semiconductor chips equally extensively used in the art for active componentry are relatively rigid.

The manufacturing techniques for each type of part can produce extremely fine deposited contacts, so that in making bonding connections of apparatus parts optical assistance for alignment is essential as the width and separation is reduced toward about 100 micrometers. Individual members of the fine periodicity contact patterns are frequently bonded together to form electrical contacts between mating members. Those contacts are usually made by the standard techniques in the art of using a heat fusible metal such as solder or a heat and pressure responsive anisotropic conductor film (ACF).

In accordance with the invention, in aligning mating fine periodicity superimposed objects the accuracy of the alignment is enhanced by the use of reflected light from the substrate supporting one of the superimposed objects. An optical alignment apparatus is provided, that using an observation path passing between the substrates on which the pads are mounted, provides a view of the reflection of one of the superpositioned objects in the surface of the substrate supporting the other object so that with "X"–"Y" adjustment of the relative position of the substrates alignment can be achieved.

Figure 1:
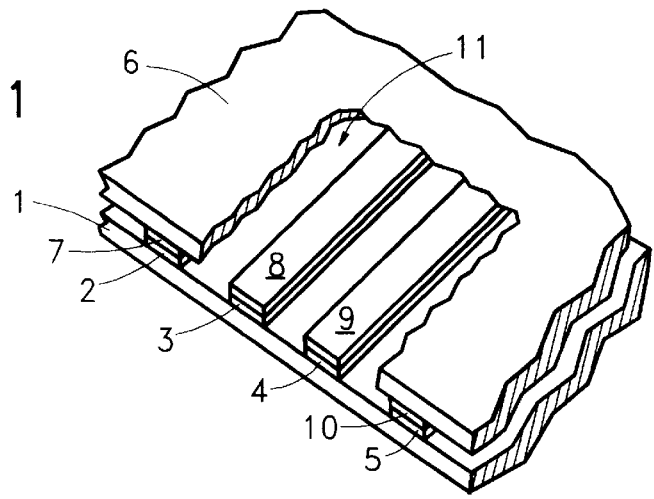
FIG. 1 is a perspective illustration of an example aligned fine periodicity conductor or pad region at the edge of superpositioned substrates.

Referring to FIG. 1 there is shown a perspective illustration of an example aligned fine periodicity conductor or pad region at the edge of superpositioned substrates. In FIG. 1, on a first substrate 1 there are positioned fine periodicity in width and separation pads or conductors 2, 3, 4, and 5. Over the substrate 1 there is a substrate 6 that has a mating pattern of fine periodicity conductors 7, 8, 9, and 10 each of which contacts a corresponding contact. The substrate 6 is broken away in the area 11 to illustrate that the ability to align the 2–5 contacts with the 7–10 contacts is hampered by the presence of the substrate 6 obscuring visibility.

Figure 2:
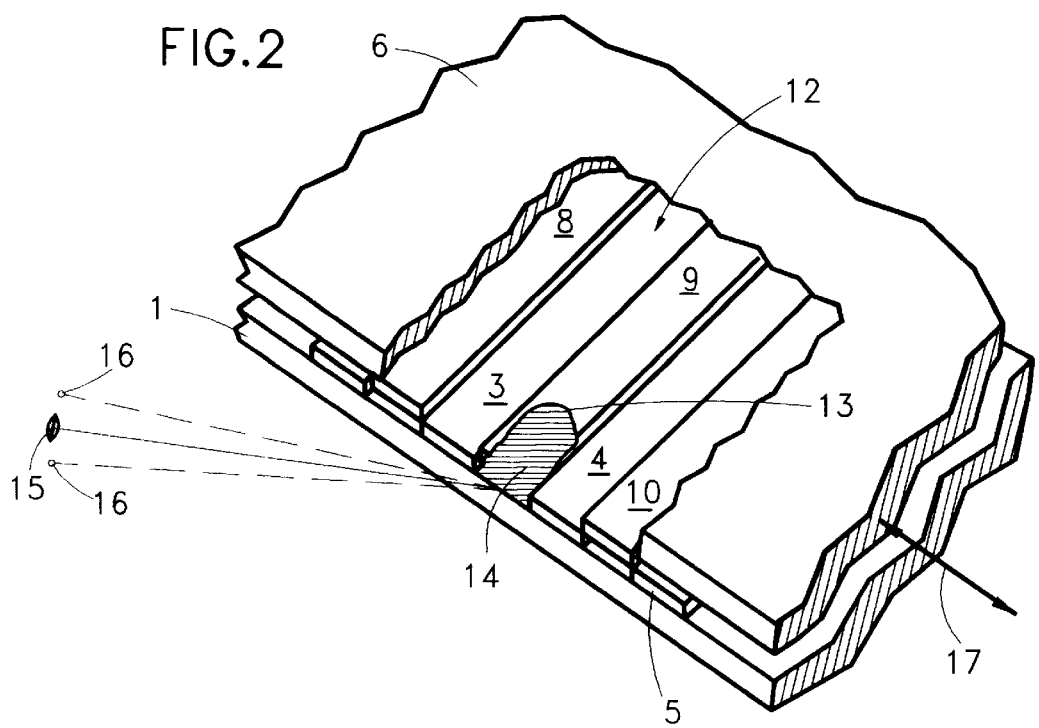
FIG. 2 is a perspective illustration of the relative positioning of the elements in the practice of the invention on misaligned conductor or pad bearing substrates.

Referring to FIG. 2 in accordance with the invention optical focusing on the surface of the substrate beside a conductor permits the reflection of the upper object to be detected in the surface of the lower substrate and relative motion imparted to the substrates eliminating the reflection produces alignment. In FIG. 2, the substrates 1 and 6 are misaligned and conductor 9 is over the space between conductors 3 and 4 instead of in contact with conductor 4 as illustrated in FIG. 1. Through the broken out region 12 of the substrate 6 and the broken out portion 13 of the conductor 9 the reflection 14 is shown shaded to indicate the presence of reflected light which is observed in the optical viewing element 15 surrounded by a standard ring light 16 used in the art. The reflected light is brighter as the substrate surface is smoother. The crystal surface of a semiconductor substrate is quite reflective. Surfaces smooth enough for 75 to 100 micrometer fine pitch resolution have sufficient reflectivity.

When relative motion, as indicated by the double pointed arrow 17, is applied to the substrates 1 and 6 the reflected light observed in the viewing element 14 changes markedly when the conductors are aligned in contact.

Figure 3:
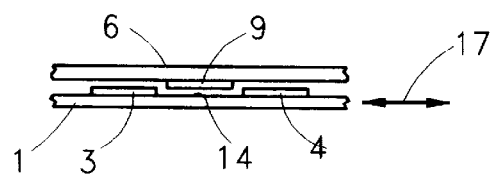
FIG. 3 is a front view of the relative positioning of the conductors or pads on misaligned substrates.

Referring next to FIG. 3 a front view is shown of the relative positioning of the conductors or pads on misaligned substrates. In FIG. 3 the reflected light area 14 is between conductors 3 and 4 and changes when the conductor 9 is moved over either conductor 3 or 4 by a force on one substrate through arrow 17.

Figure 4:
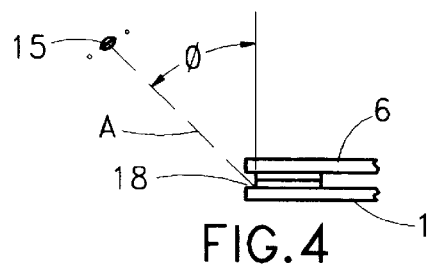
FIG. 4 is a diagrammatic illustration of the optical considerations in the practice of the invention.

Referring next to FIG. 4 there is shown a diagrammatic illustration of the optical considerations in the practice of the invention. The optical path "A" for viewing passes under any overhanging portion 18 of a substrate 6 which is established by positioning the elements 15 and 16 at an angle 0 from the vertical, such as 45 degrees to permit viewing in between the substrates.

What has been described is a tooling principle, wherein, alignment of superpositioned objects on opposing substrates is achieved through relative movement of the substrates responsive to an image of one object reflected from the surface of the opposite substrate.

What is claimed is:

1. Electronic fabrication apparatus for aligning an element that is positioned on a first mating surface of a supporting substrate that is to be brought into contact with a second element that is positioned on a second mating surface of a second superpositioned substrate, comprising in combination:

an optical viewer and light source combination positioned to project light and to view reflected light in the contacting region of said first and second mating surfaces of said supporting and said superpositioned substrates, said optical viewer being focused on an area of said mating surface of said supporting substrate adjacent said element on said supporting substrate mating surface that is to be aligned, and, movement means operable to produce relative movement of said mating surfaces and alignment of said elements responsive to a reduction of reflected light detected in said optical viewer.

2. The improvement of claim 1 wherein said optical viewer is a lens surrounded by a ring illumination.

3. The improvement of claim 2 wherein said relative movement is produced by an "X"–"Y" motion element.

4. The improvement of claim 2 wherein first and second elements to be aligned are conductors in fine pitch conductor patterns.

5. The improvement of claim 4 wherein said fine pitch conductor patterns have 100 or smaller micrometer spacing.

6. The process of aligning superimposed first and second substrates each having a corresponding pattern of fine pitch contact members on mating substrate surfaces, comprising in combination the steps of:

focusing optical magnification on a reflection of a first contact on the surface of said first substrate that is in an area of the mating surface of said second substrate adjacent a second contact which corresponds in said pattern to the conductor producing said reflection, and, relatively moving said first and second substrates with respect to each other to bring said first and second contacts together in response to elimination of said reflection.

7. The process of claim 6 including bonding said mating contacts to each other.

* * * * *